(12) United States Patent
Yune

(10) Patent No.: US 7,719,034 B2
(45) Date of Patent: May 18, 2010

(54) DEVICE OF ACTIVE REGIONS AND GATES AND METHOD OF FORMING GATE PATTERNS USING THE SAME

(75) Inventor: Hyoung Soon Yune, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 621 days.

(21) Appl. No.: 11/618,627

(22) Filed: Dec. 29, 2006

(65) Prior Publication Data

US 2007/0158693 A1    Jul. 12, 2007

(30) Foreign Application Priority Data

Jan. 9, 2006    (KR)    ............... 10-2006-0002328

(51) Int. Cl.
    *H01L 29/80* (2006.01)
(52) U.S. Cl. .............. 257/213; 257/296; 257/301; 257/297; 257/68; 257/69; 257/E27.084
(58) Field of Classification Search ............. 257/68–71, 257/296–309, 905–908, E27.084–E27.097, 257/E27.075
    See application file for complete search history.

(56) References Cited

U.S. PATENT DOCUMENTS

| 5,087,951 | A | * | 2/1992 | Chance et al. | ............... | 257/296 |
| 5,140,389 | A | * | 8/1992 | Kimura et al. | ............... | 257/309 |
| 6,657,901 | B2 | | 12/2003 | Kajigaya et al. | | |
| 6,832,364 | B2 | | 12/2004 | Heng et al. | | |
| 7,026,679 | B2 | * | 4/2006 | Uchiyama et al. | ............ | 257/303 |

FOREIGN PATENT DOCUMENTS

KR    1020030071199 A    9/2003

* cited by examiner

*Primary Examiner*—N Drew Richards
*Assistant Examiner*—Swapneel Chhaya
(74) *Attorney, Agent, or Firm*—Townsend and Townsend and Crew LLP

(57) ABSTRACT

A semiconductor device having an improved gate process margin includes two active regions spaced apart from each other on a semiconductor substrate and respectively having bent sides with recesses and protrusions corresponding to each other, and two line-shaped gate patterns respectively formed in the longitudinal directions of the active regions. A gap at which the two gate patterns are spaced apart from each other by the recesses and the protrusions in the active regions is relatively narrower by a width difference between the recesses and the protrusions.

8 Claims, 6 Drawing Sheets

DEVICE OF ACTIVE REGIONS AND GATES AND METHOD OF FORMING GATE PATTERNS USING THE SAME

CROSS-REFERENCES TO RELATED APPLICATIONS

The present application claims priority to Korean patent application number 10-2006-002328, filed on Jan. 9, 2006, which is incorporated by reference in its entirety

BACKGROUND OF THE INVENTION

The present invention relates to a semiconductor device, and more particularly to a method of forming a gate pattern, which reduces etch bias.

As the degree of semiconductor integration increases, it becomes difficult to attain the critical dimensions (CDs) of a semiconductor device. Since etch bias may be locally increased during an exposure process and an etching process due to loading effects, defects may be generated such that the CD of the pattern cannot be obtained in a specific region such as a peripheral circuit region.

As the size of the transistor decreases, it may be difficult to attain a gate CD because of the loading effect in the peripheral circuit region, which causes the rapid decrease of the process margins, In a memory device such as a DRAM, the gate of a transistor in a cell region and in the peripheral circuit region may be formed at the same time. In the peripheral circuit region, which has relatively less dense isolated gate patterns than the cell region, it is difficult to attain a gate CD because of the loading effect when patterning the gates. This may be caused by designing a much larger spacing gap between the gates in the peripheral circuit than in the cell region.

In order to reduce the loading effect, dummy patterns may be disposed around the isolated gates. When the gates in the peripheral circuit region are patterned along with dummy patterns, the pseudo pattern density of the peripheral circuit region can be made similar to the pattern density of the cell region, eliminating the loading effect. Therefore, the adoption of the dummy patterns can increase the process margins during the gate patterning by decreasing the etch bias due to the loading effect which becomes locally concentrated during the patterning of the isolated gates.

FIG. 1 is a conventional layout schematically illustrating a gate process margin in a peripheral circuit region, and FIG. 2 is a magnified view of section "A" in FIG. 1.

Referring to FIGS. 1 and 2, active regions 10 formed on a substrate are defined by device isolation regions 15. Gate patterns 20 are arranged to run across the active regions 10 in the longitudinal direction, and contact holes 40 are arranged in the active regions 10 on the left and right side of the gate patterns 20 for the connection with wirings such as bit lines.

In this case, the layouts in FIGS. 1 and 2 are layouts of active regions and gates adopted in the peripheral circuit regions of a memory device, such as, a DRAM. The gate patterns 20 in the peripheral circuit region are designed with a spacing gap wider than that between the cell gates so that the gate patterns 20 are less dense.

Around a relatively isolated first gate pattern 21 of a first active region 11 in the peripheral circuit region, there are not other gate patterns 20 which are comparable to mutually dense gate patterns 23 of second active region 13 in other cell regions. Thus, when the isolated first gate pattern 21 is exposed and developed or etched, the etch bias may be locally increased around the first gate pattern 21. For this reason, the first gate pattern 21 may be patterned such that realized CDs are remarkably smaller than designed CD. To prevent this problem, in sections where the distance between the gates 20 is designed to be large, a dummy pattern 30 which is similar to the gate patterns 20 but does not actually function as a gate is placed to decrease the etch bias. By doing so, the photolithography margin is increased. However, since the dummy pattern 30 has a shape similar to those of the second dense gate patterns 23 but does not serve as a gate, the dummy pattern 30 is not formed in the active regions 10, but preferably in the device isolation regions 15.

However, as shown in FIG. 2, in a case that a gap d1 between the active regions 10 such as the first active region 11 is very narrow, (e.g., the gap d1 is about 220 nm) it is difficult to extend the dummy patterns 30 between the active regions 10. The dummy patterns 30 can be adopted when the gap between the active regions 10 is greater than 400 nm. However, when the gap d2 between the first gate patterns 21 and the second gate patterns 23 is about 940 nm, the dummy gate patterns 30 cannot be constructed, since a sufficient gap between the active regions 10 is not available. When the dummy patterns 30 are constructed, the gap d3 between the dummy patterns 30 and the second gate patterns 23 is about 470 nm.

As such, since the first gate patterns 21 maintain the isolated status in the region where the dummy patterns 30 are not adopted, the etch bias of the first gate patterns 21 is remarkably increased during the exposure, the development, and the etching. Due to this, since there is a possibility of reduction of the photolithography margin or a pattern defect such that the line width of the first gate patterns 11 is formed narrower than a designed line width or the patterns are not formed, the uniformity of the line width of the gate patterns 20 are decreased.

Therefore, a gate pattern forming method which improves the gate process margin in the peripheral circuit region where the isolated patterns are generated and where dummy gates patterns cannot be used is desirable.

SUMMARY OF THE INVENTION

The embodiments of the present invention provide a layout of a semiconductor for the improvement of gate process margins.

In accordance with one embodiment, a layout of a semiconductor device for improving the gate process margin includes: two active regions spaced apart from each other on a semiconductor substrate and having alternating recesses and protrusions in a zig zag pattern; two line-shaped gate patterns formed on the active regions, wherein the gap between the two gate patterns is narrower by the width difference between the recesses and the protrusions.

In another embodiment, a semiconductor device includes a first active region having a first gate pattern, a first protruding portion, and a first recess portion. A second active region has a second gate pattern, a second protruding portion, and a second recess portion. The first and second active regions are provided adjacent to each other. The first protruding portion faces the second recess portion, and the first recess portion faces the second protruding portion. The first and second protruding portions are male portions and the first and second recess portions are female portions.

The first recess portion and the first protruding portion are defined by a boundary that has a sloping shape. The first gate pattern extends longitudinally along the first active region and defines a first side of the first active region and a second side of the first active region, the first side having the first protruding portion and the first recess portion.

The device further includes one or more contact holes formed in the first side of the first active region; and a plurality of contact holes formed in the second side of the first active region. The number of the contact holes in the first side is less than the number of the contact holes in the second side. The second side of the first active region has a substantially linear edge without a protrusion or a recess.

The contact hole formed in the first side of the first active region has a larger planar dimension than the contact hole formed in the second side of the second active region. At least one contact hole is formed in the first protrusion portion of the first active region, the at least one contact hole having a length that is longer than a width. The at least one contact hole has a planar shape that is substantially rectangular. The first and second active regions are defined in a peripheral region of the device.

DESCRIPTION OF THE SPECIFIC EMBODIMENTS

In the embodiments of the present invention, regions of semiconductor devices where dummy patterns cannot be inserted, the boundaries of active regions are stepped so that CDs (or line widths) between gates can be decreased. Even though the dummy patterns may not be inserted, sufficiently wide line widths of the gates can be obtained, while increasing the gate pattern density.

Figure 1:
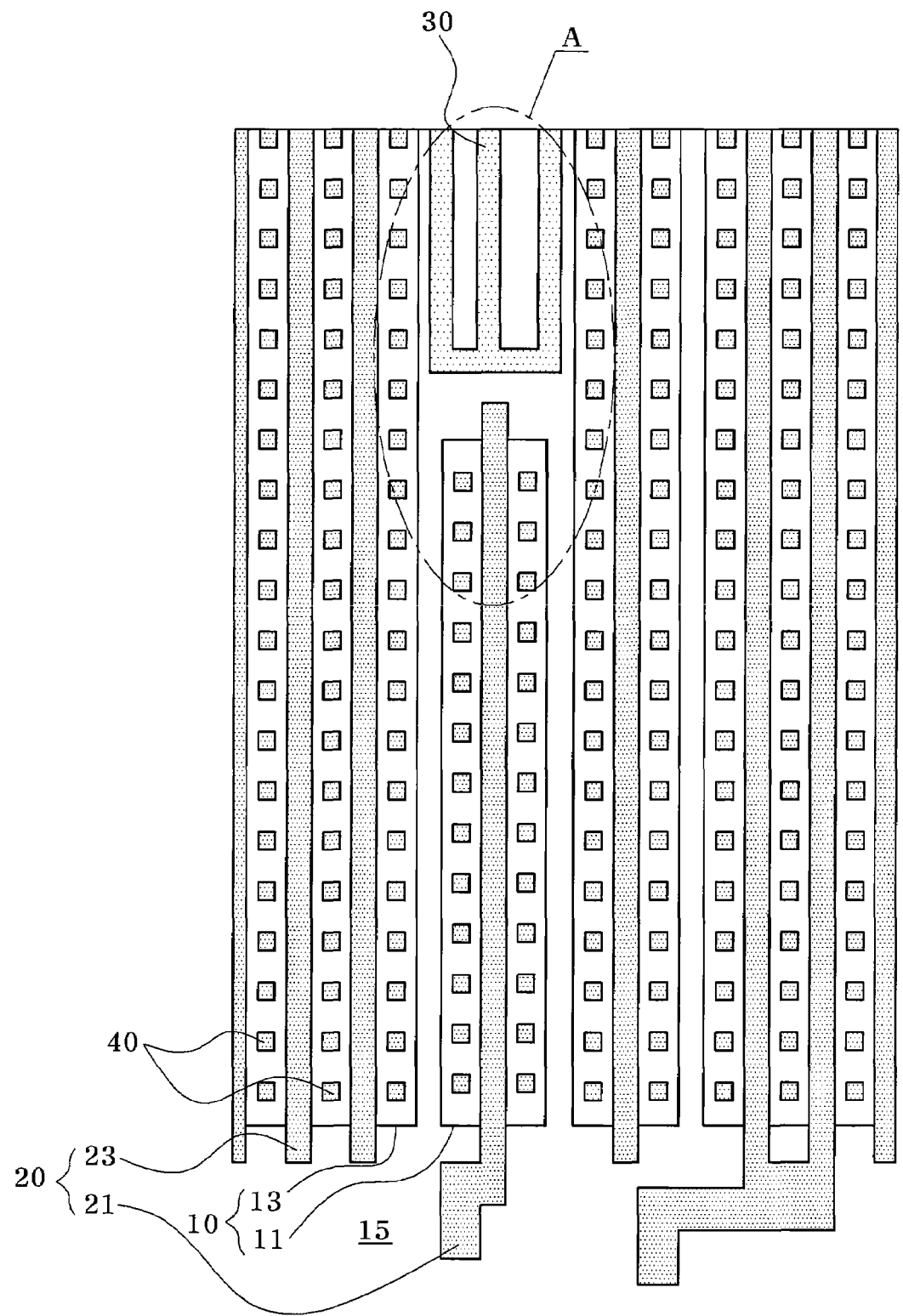
FIGS. 1 and 2 are conventional schematic layouts illustrating the gate process margins in a peripheral circuit region.
Figure 2:
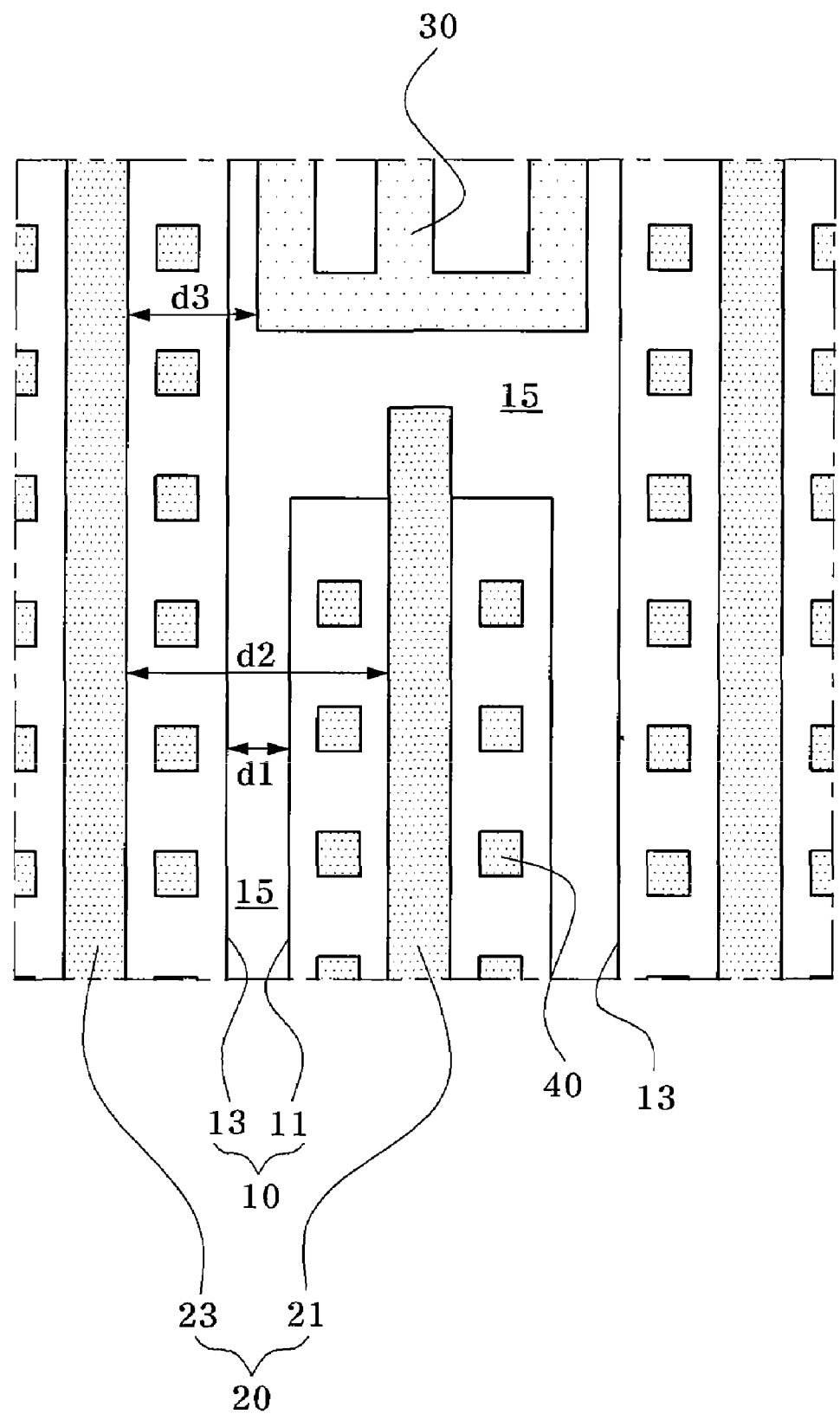
Figure 3:
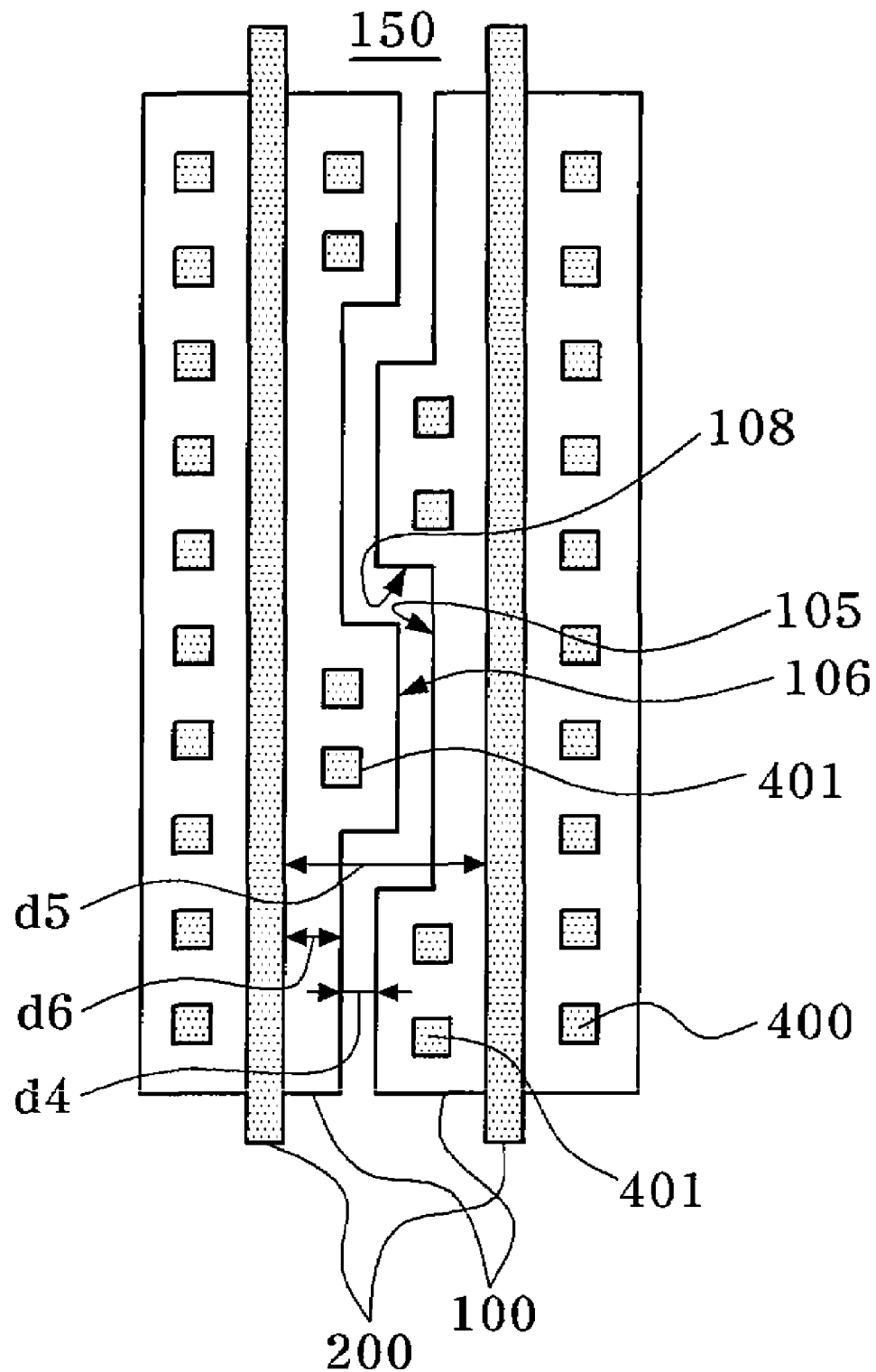
FIG. 3 is a schematic view illustrating a layout for the improvement of a gate process margin according to an embodiment of the present invention and a method of forming a gate pattern.

FIG. 3 illustrates a layout for a peripheral circuit region of a memory device (e.g., a DRAM) according to one embodiment of the present invention. The layout includes two active regions 100, having a recess 105 and a protrusion 106 that are formed at opposite sides from each other, and two line-type gate patterns 200 in the active regions 100. The recesses 105 and the protrusions 106 are repeatedly formed on both sides in a saw tooth pattern.

By doing so, a gap d4 spacing (or a first gap) between the two active regions 100 is still maintained at about 220 nm, and a gap d5 (or a second gap) between the gate patterns 200 can be narrowed. For example, when taking the same design rule into consideration in the conventional art, a gap of 940 nm can be reduced to 700 nm. In this case, the effective width d6 of the recess 105 in the active region 100 at the side of the gate patterns 200 can be regarded as 120 nm.

For this reason, since the gap between the gate patterns 200 can be reduced by about 25%, the etch bias locally concentrated to the gate patterns during exposure, development, and etching can be reduced. In other words, when the gate patterns are actually formed on a semiconductor substrate using a photo mask in which the layout in FIG. 3 is implemented, a sufficient line width can be guaranteed by the reduction of the etch bias.

By doing so, in the embodiment of the present invention, the margin of the photolithography is increased and the uniformity of the line widths of the gate patterns formed on the semiconductor substrate is improved.

Contact holes 400 are normally arranged in the active regions 100 on both sides of the gate patterns 200. In this case, the contact holes 400 are not arranged in the recesses 105, but contact holes 401 are arranged in the protrusions 106 where sufficient line widths are maintained. The contact holes may be of angular or round shape.

Figure 4:
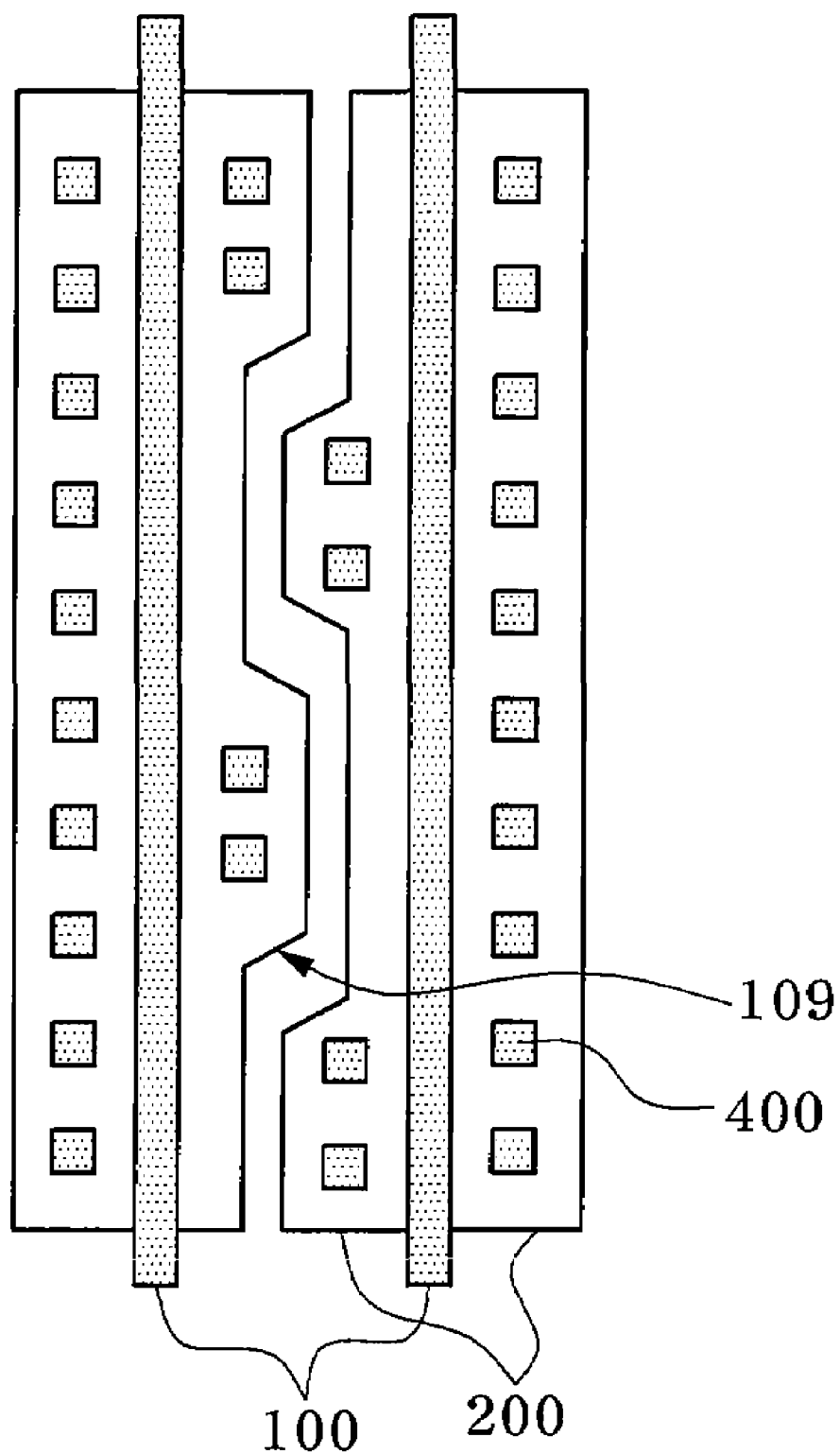
FIGS. 4 to 6 are schematic views illustrating a layout for the improvement of the gate process margin according to another embodiment of the present invention.

The recesses 105 and the protrusions 106, as shown in FIG. 3, are formed with perpendicular patterns having perpendicular sides. However, when forming a device isolation region 150 at the perpendicular sides 108 by shallow trench isolation (STI), a void may be generated by an inferior gap fill when filling trenches. Therefore, the perpendicular sides 108 can be modified to have inclined (or sloped) sides 109 as shown in FIG. 4.

Figure 5:
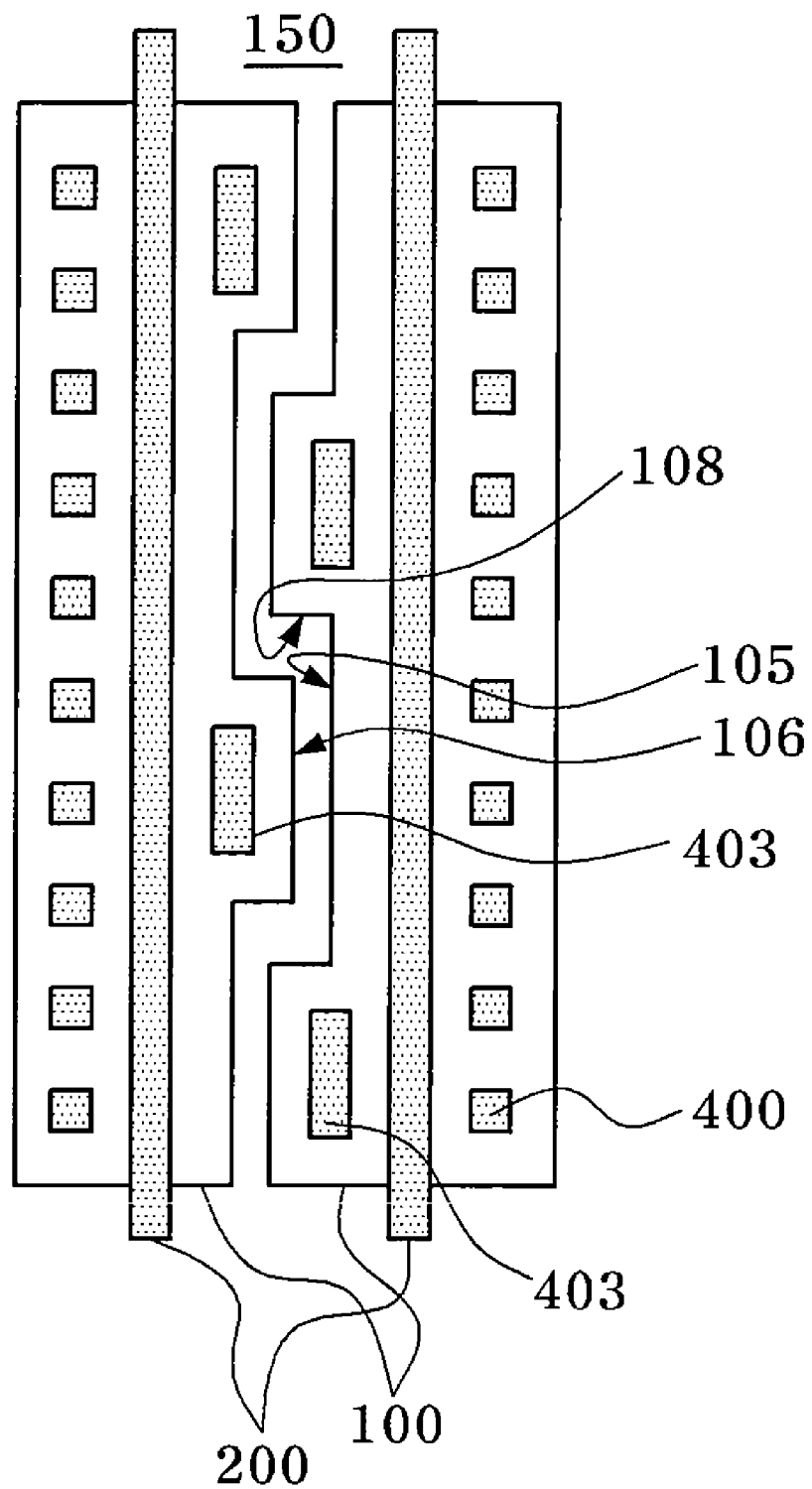
Figure 6:
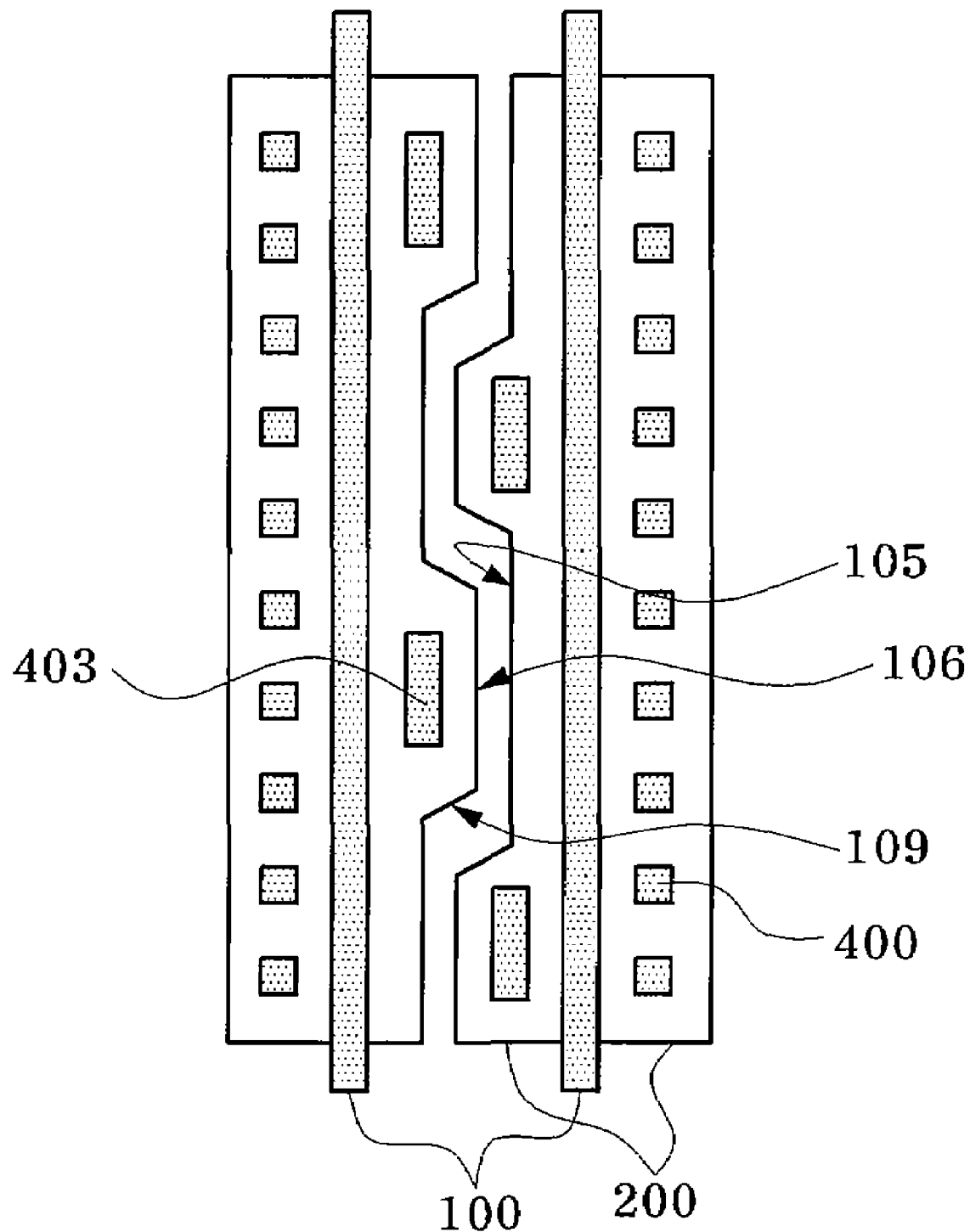

Since the contact holes 400 are removed from the recesses 105, the number of contacts may be decreased, which may increase the contact resistance. To prevent this increase of resistance, as shown in FIGS. 5 and 6, contact holes 403 may be formed in the form of a rectangular shape rather than the regular square shape so as to increase the area of the contact. That is, the contact hole 403 is formed by connecting two or more contact holes 401 to provide the former with a longer width.

The photo mask in which the layout for improving the gate process margin is implemented can be employed in an exposure device using various exposure sources with various wavelengths such as an I-line, KrF, ArF, F2, and the like to be used in the photolithography for exposing and developing the gate patterns. In this case, the layout may be applied to a device for implementing the gates such as an SRAM, a Flash device, a logic device, and the like.

According to the embodiments described above, when dummy patterns cannot be inserted from lack of space, the shape of the active regions is altered so that the gap between the gate patterns in the active regions can be reduced. This makes it possible to make the isolated patterns in the peripheral circuit region identical or similar to those of the dense patterns. As a result, the etch bias of the gate patterns can be reduced during photolithography, development, and etching. Therefore, the line widths of the gate patterns can be obtained and the uniformity of the overall line widths of the patterns can be improved.

The preferred embodiments of the present invention have been disclosed for illustrative purposes. Those skilled in the art will appreciate that various modifications, additions and substitutions are possible, without departing from the scope and spirit of the invention as disclosed in the accompanying claims.

What is claimed is:

1. A semiconductor device, comprising:
   a cell region and a peripheral region defined on a semiconductor substrate;
   first and second active regions formed facing each other on the peripheral region, the first and second active regions each comprising a recessed portion and a protruding portion, wherein the recessed portion of the first active region faces the protruding portion of the second active region, a width of each recessed portion being smaller than a width of each protruding portion;
   a first gate pattern longitudinally extending on the first active region, wherein the first gate pattern defines a first side of the first active region and an opposite second side of the first active region, the first side of the first active region including the protruding portion and the recessed portion of the first active region, the second side of the first active region comprising a linear edge;

a second gate pattern longitudinally extending parallel to the first gate pattern on the second active region, wherein the second gate pattern defines a first side of the second active region and an opposite second side of the second active region, the first side of the second active region including the protruding portion and the recessed portion of the second active region, the second side of the second active region comprising a linear edge;

at least one first contact hole formed in the protruding portion of the first side of each of the first and second active regions; and a plurality of second contact holes formed in the second side of each of the first and second active regions.

2. A method of forming a semiconductor device, the method comprising:

forming a cell region and a peripheral region on a semiconductor substrate;

forming first and second active regions facing each other on the peripheral region, the first and second active regions each comprising a recessed portion and a protruding portion, wherein the recessed portion of the first active region faces the protruding portion of the second active region, a width of each recessed portion being smaller than a width of each protruding portion;

forming a first gate pattern longitudinally extending on the first active region, wherein the first gate pattern defines a first side of the first active region and an opposite second side of the first active region, the first side of the first active region including the protruding portion and the recessed portion of the first active region, the second side of the first active region comprising a linear edge;

forming a second gate pattern longitudinally extending parallel to the first gate pattern on the second active region, wherein the second gate pattern defines a first side of the second active region and an opposite second side of the second active region, the first side of the second active region including the protruding portion and the recessed portion of the second active region, the second side of the second active region comprising a linear edge;

forming at least one first contact hole in the protruding portion of the first side of each of the first and second active regions; and forming a plurality of second contact holes in the second side of each of the first and second active regions.

3. The device of claim 1, wherein the recessed portion and the protruding portion of the first active region are defined by a boundary that has a sloping shape.

4. The device of claim 1, wherein the number of the first contact holes in each first side is less than the number of the second contact holes in each second side.

5. The device of claim 1, wherein a contact hole is not formed in the recessed portion of the first or second active regions.

6. The device of claim 1, wherein the at least one first contact hole formed in the first active region has a larger planar dimension than the second contact hole formed in the second active region.

7. The device of claim 1, wherein the at least one first contact hole formed in the first active region has a length that is longer than a width.

8. The device of claim 1, wherein the at least one first contact hole formed in the first active region has a planar shape that is substantially rectangular.

* * * * *